(12) United States Patent
Noda et al.

(10) Patent No.: US 10,297,531 B2
(45) Date of Patent: May 21, 2019

(54) METHOD FOR PRODUCING SEMICONDUCTOR DEVICE AND SEMICONDUCTOR DEVICE

(71) Applicant: Toshiba Memory Corporation, Tokyo (JP)

(72) Inventors: Yuki Noda, Yokkaichi Mie (JP); Ippei Kume, Yokkaichi Mie (JP); Kazuhiko Nakamura, Nagoya Aichi (JP); Koichi Sato, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,978

(22) Filed: Sep. 4, 2017

(65) Prior Publication Data

US 2018/0286782 A1    Oct. 4, 2018

(30) Foreign Application Priority Data

Mar. 29, 2017    (JP) .................... 2017-065619

(51) Int. Cl.
*H01L 23/48*     (2006.01)
*H01L 21/302*    (2006.01)
(Continued)

(52) U.S. Cl.
CPC ...... *H01L 23/481* (2013.01); *H01L 21/02126* (2013.01); *H01L 21/288* (2013.01);
(Continued)

(58) Field of Classification Search
CPC .............. H01L 23/481; H01L 23/5329; H01L 23/5283; H01L 23/53209; H01L 21/3081;
(Continued)

(56) References Cited

U.S. PATENT DOCUMENTS 6,380,628 B2*  4/2002  Miller ............... H01L 21/76816
                                                    257/762
8,541,298 B2   9/2013  Kawakubo
(Continued)

FOREIGN PATENT DOCUMENTS

JP     2004-152967 A    5/2004
JP     2010114201 A     5/2010
(Continued)

*Primary Examiner* — Dao H Nguyen
(74) *Attorney, Agent, or Firm* — Kim & Stewart LLP (57) ABSTRACT

A method of producing a semiconductor device includes forming, on a semiconductor substrate comprising a first surface on which an insulating layer covering a wiring structure and a first through via passing through the insulating layer are formed and a second surface opposed to, and facing away from, the first surface, a patterned first insulating film comprising at least one opening therethrough on the second surface, forming a through via hole inwardly of the second surface within which the wiring structure is exposed, by anisotropic dry etching into the second surface side of the semiconductor substrate through the at least one opening in the first insulating film, using a gas mixture containing $SF_6$, $O_2$, $SiF_4$, and at least one of $CF_4$, $Cl_2$, $BCl_3$, $CF_3I$, and HBr, and forming a second through via in the through via hole.

6 Claims, 6 Drawing Sheets

(51) Int. Cl.
*H01L 21/311* (2006.01)
*H01L 21/283* (2006.01)
*H01L 23/52* (2006.01)
*H01L 21/768* (2006.01)
*H01L 21/3065* (2006.01)
*H01L 23/528* (2006.01)
*H01L 21/02* (2006.01)
*H01L 23/532* (2006.01)
*H01L 23/00* (2006.01)
*H01L 21/308* (2006.01)
*H01L 21/288* (2006.01)

(52) U.S. Cl.
CPC ...... *H01L 21/2885* (2013.01); *H01L 21/3065* (2013.01); *H01L 21/3081* (2013.01); *H01L 21/76802* (2013.01); *H01L 21/76831* (2013.01); *H01L 21/76841* (2013.01); *H01L 21/76873* (2013.01); *H01L 21/76874* (2013.01); *H01L 21/76879* (2013.01); *H01L 21/76898* (2013.01); *H01L 23/5283* (2013.01); *H01L 23/5329* (2013.01); *H01L 23/53209* (2013.01); *H01L 24/13* (2013.01); *H01L 2224/13025* (2013.01)

(58) Field of Classification Search
CPC ......... H01L 21/02126; H01L 21/76802; H01L 21/2885; H01L 21/288; H01L 21/3065; H01L 21/21; H01L 21/76874; H01L 21/76873; H01L 21/76879; H01L 21/76841; H01L 24/13
USPC ........ 257/737, 621, 698, 773, 774, E23.011, 257/E23.145, E23.174, E25.013, E25.017, 257/E21.218, E21.219, E21.249, E21.259, 257/E21.495, E21.579, E21.586; 438/624, 652, 667, 675, 677, 719
See application file for complete search history.

(56) References Cited

U.S. PATENT DOCUMENTS

| | | | |
|---|---|---|---|
| 8,546,256 B2* | 10/2013 | Jung | H01L 21/02057 257/E21.159 |
| 8,664,117 B2 | 3/2014 | Ono et al. | |
| 9,048,192 B2* | 6/2015 | Kim | H01L 21/3065 |
| 9,070,637 B2 | 6/2015 | Yoda et al. | |
| 9,406,552 B2* | 8/2016 | Chen | H01L 24/29 |
| 9,881,851 B2 | 1/2018 | Uchida | |
| 2006/0292877 A1* | 12/2006 | Lake | H01L 21/30655 438/694 |
| 2009/0017576 A1* | 1/2009 | Borthakur | H01L 27/14618 438/73 |
| 2012/0199984 A1* | 8/2012 | Fujita | H01L 21/76898 257/774 |
| 2014/0227876 A1 | 8/2014 | Tohnoe | |

FOREIGN PATENT DOCUMENTS

| | | |
|---|---|---|
| JP | 2013084695 A | 5/2013 |
| JP | 5373669 B2 | 12/2013 |
| JP | 5566803 B2 | 8/2014 |
| TW | 201308559 A | 2/2013 |
| TW | 201709417 A | 3/2017 |

* cited by examiner

METHOD FOR PRODUCING SEMICONDUCTOR DEVICE AND SEMICONDUCTOR DEVICE

This application is based upon and claims the benefit of priority from Japanese Patent Application No. 2017-065619, filed Mar. 29, 2017, the entire contents of which are incorporated herein by reference.

FIELD

Embodiments described herein relate generally to methods for producing a semiconductor device and a semiconductor device.

BACKGROUND

In a method for fabricating a semiconductor device, the Bosch process is sometimes used to form a through via hole. When the Bosch process is used, there is a trade-off between the processing rate (e.g., throughput) and a scallop size (i.e., the non-flatness of the side wall of a through via hole). An increase in the processing rate decreases the flatness of the side wall of the through via hole.

A decrease in the flatness of the side wall of a through via hole sometimes makes it difficult to form an insulating film, or a plating seed layer, on the side wall of the through via hole. Additional processing to improve the flatness of the side wall to reduce the amplitude of the scallops may be performed, but this increases the number of processes required to make the through silicon via hole and results in decreased throughput.

DETAILED DESCRIPTION

Embodiments provide a semiconductor device with a through-silicon via (TSV) that reduces the incidence of a defect in the TSV and a method for producing such a semiconductor device.

In general, according to one embodiment, a method for producing a semiconductor device includes forming, on a semiconductor substrate comprising a first surface on which an insulating layer covering a wiring structure and a first through via passing through the insulating layer are formed and a second surface opposed to, and facing away from, the first surface, a patterned first insulating film comprising at least one opening therethrough on the second surface, forming a through via hole inwardly of the second surface within which the wiring structure is exposed, by anisotropic dry etching into the second surface side of the semiconductor substrate through the at least one opening in the first insulating film, using a gas mixture containing $SF_6$, $O_2$, $SiF_4$, and at least one of $CF_4$, $Cl_2$, $BCl_3$, $CF_3I$, and $HBr$, and forming a second through via in the through via hole.

First Embodiment

Hereinafter, a semiconductor device and a method for producing the semiconductor device according to an embodiment will be described in detail with reference to the attached drawings. It is to be noted that the following description is not intended to limit the embodiment. Moreover, in the following description, an element formation surface of a semiconductor substrate on which an element is to be formed is assumed to be a first surface and a surface opposite to the first surface is assumed to be a second surface.

Figure 1:
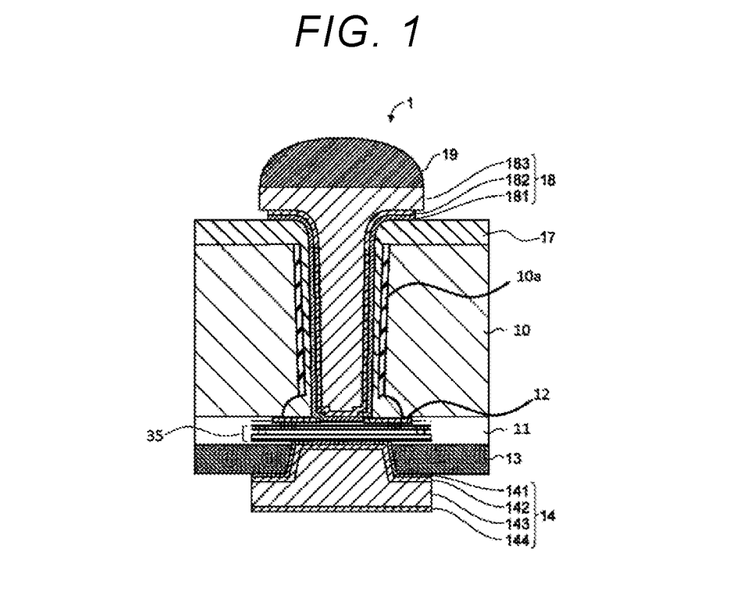
FIG. 1 is a sectional view of a semiconductor device depicting a schematic configuration example of a semiconductor device according to an embodiment.

FIG. 1 is a sectional view depicting a schematic configuration example of the semiconductor device according to the embodiment. As depicted in FIG. 1, a semiconductor device 1 includes a semiconductor substrate 10, an insulating layer 11, a shallow trench isolation (STI) 12, an insulating layer 13, a first through via 14, an insulating layer 17, a second through via 18, and a conductive bonding material (e.g., bump) 19. Moreover, on the side wall of the second through via 18, a protective film 10a is provided.

The semiconductor substrate 10 is, for example, a silicon substrate. The semiconductor substrate 10 may be thinned to a thickness of 50 μm (micrometers) or less, for example, a thickness of the order of 30±5 μm.

The semiconductor substrate 10 includes, on a first surface thereof, active areas in which semiconductor elements and shallow trench isolation structures (STI) 12 are formed, wherein the STI's electrically separate the active areas from each other. In the active areas, semiconductor elements (not depicted in the drawing) such as a memory cell array, a transistor, a resistance element, or a capacitor element are formed. As the STI 12 material, for example, an insulating film such as a silicon oxide film is used. On the STI 12, the first through via 14 and a wiring structure 35 which electrically connects the semiconductor elements to the second through via 18 are provided. The wiring structure 35 is provided on the STI 12 and is electrically connected to the semiconductor element (for example, a transistor) provided on the first surface of the semiconductor substrate 10. The semiconductor elements and the wiring structure 35 are coated with the insulating layers 11 and 13. On a second surface of the semiconductor substrate 10, a conductive bonding material 19 or the like which is electrically connected to the second through via 18 is provided.

The insulating layer 13 covers the wiring structure 35 to protect the wiring structure 35. The insulating layer 13 may include a passivation layer which covers the wiring structure 35 and an organic layer which covers the passivation layer. The passivation layer may be a single layer film of a silicon nitride film (SiN), a silicon oxide film ($SiO_2$), or a silicon oxynitride film (SiON), or a stacked film formed of two or more of these films. As the organic layer, a resin material such as photosensitive polyimide may be used.

The first through via 14 is in contact with the wiring structure 35. The first through via 14 may include a barrier metal layer 141 that covers at least the inner surface of a through via hole, a seed metal layer 142 on the barrier metal layer 141, and a through via 143 on the seed metal layer 142. The barrier metal layer 141 may be omitted. On the through via 143, a material film 144 that functions when the semiconductor devices 1 are integrated in the thickness direction of the semiconductor substrate 10 may be provided.

As the barrier metal layer 141, titanium (Ti), tantalum (Ta), or ruthenium (Ru), for example, may be used. As the seed metal layer 142, copper (Cu) or a stacked film (Ni/Cu) of nickel and copper, for example, may be used. As the through via 143, nickel (Ni), for example, may be used. As the material film 144, gold (Au), tin (Sn), copper (Cu), tin-copper (SnCu), tin-gold (SnAu), or tin-silver (SnAg), for example, may be used. However, the layer structure and materials of the first through via 14 can be changed as appropriate in accordance with the intended use. For instance, the layer structure or material of the barrier metal layer 141, the seed metal layer 142, or the material film 144 may be changed as appropriate in accordance with the conductive material or the formation method used for the through via 143.

By being in contact with the wiring structure 35, the second through via 18 electrically connects the wiring structure 35 to an area on the second surface of the semiconductor substrate 10. On the side wall of the second through via 18, a protective film 10a containing Si, O, and at least one or more elements of F, Cl, I, and Br is provided.

The second through via 18 may include a barrier metal layer 181 that covers at least the inner surface of a through via hole, a seed metal layer 182 on the barrier metal layer 181, and a through via 183 on the seed metal layer 182. The metal materials used for the barrier metal layer 181, the seed metal layer 182, and the through via 183 may be the same as the metal materials used for the barrier metal layer 141, the seed metal layer 142, and the through via 143, respectively, of the first through via 14. The through via 183 may have a gap formed therein. Moreover, on the through via 183, a bonding material 19 for forming a bond and for electrical connection between a plurality of semiconductor devices 1 when the semiconductor devices 1 are integrated in the lengthwise direction (the thickness direction of the semiconductor substrate 10) may be provided. As the bonding material 19, solder such as tin (Sn), copper (Cu), tin-copper (SnCu), tin-gold (SnAu), or tin-silver (SnAg) may be used.

From the inner side face of the through via hole formed in the semiconductor substrate 10 to the second surface of the semiconductor substrate 10, an insulating layer 17 for preventing a short circuit between the second through via 18 and the semiconductor substrate 10 is provided. The insulating layer 17 includes, for example, a silicon oxide film ($SiO_2$). In the present embodiment, the insulating layer 17 is a single layer of a silicon oxide film; however, the insulating layer 17 may be, for example, a stacked film of a silicon oxide film and a silicon nitride film.

Figure 2:
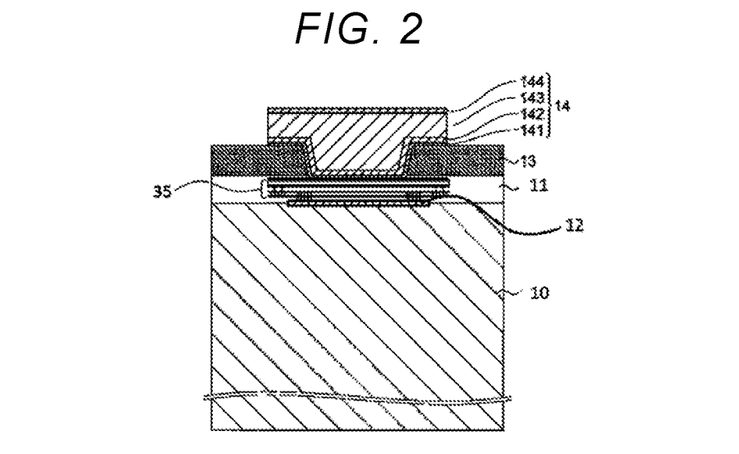
FIG. 2 is a sectional view of a partially completed semiconductor device depicting the result of a step in a method for producing the semiconductor device according to the embodiment.

Hereinafter, a method for producing the semiconductor device 1 according to the embodiment will be described in detail with reference to the drawings. FIGS. 2 to 8 are sectional views of a partially completed semiconductor device 1 depicting the result of steps in the method for producing the semiconductor device 1 according to the embodiment. In FIGS. 2 to 8, cross sections similar to the cross section of FIG. 1 are used for description, and the cross section of FIG. 2 is flipped for the purpose of illustration.

First, as depicted in FIG. 2, the STI 12 is formed on the first surface of the semiconductor substrate 10 and active areas are defined therewithin. The semiconductor substrate 10 is, for example, a silicon substrate. The STI 12 is, for example, a silicon oxide film. Next, semiconductor elements (not depicted in the drawing) are formed in the active areas. The semiconductor elements may be, for instance, a memory cell array, a transistor, a resistance element, or a capacitor element, for example. When the semiconductor elements are formed, the wiring structure 35, for example, is formed on the STI 12. The semiconductor elements and the wiring structure 35 are coated with the insulating layers 11 and 13. The insulating layer 13 may include a passivation layer that covers the wiring structure 35 and an organic layer that covers the passivation layer. As the organic layer, photosensitive polyimide, for example, is used, and an opening pattern for forming the first through via 14 is transferred to the organic layer. The opening size of the opening pattern may be about 10 μm, for instance.

Next, by etching an opening through the passivation layer of the insulating layer 13 and a portion of the insulating layer 11, the through via hole is formed using the organic layer, for example, as a mask, and the wiring structure 35 is exposed. Reactive ion etching (RIE), for instance, may be used to etch the passivation layer and the insulating layer 11. Then, on the entire portion of the insulating layer 13 including the inside of a through via hole, a barrier metal layer of titanium (Ti) and a seed metal layer of copper (Cu) are deposited in that order. For the formation of the barrier metal layer and the seed metal layer, sputtering or chemical vapor deposition (CVD), for example, may be used. The film thickness of the seed metal layer may be, for instance, about 500 nm.

Then, a mask for forming the through via 143 is formed on the seed metal layer using a Photo Engraving Process (PEP), for example. In this mask, an opening is formed in a position corresponding to the through via hole formed in the insulating layer 13. Then, on the seed metal layer exposed through the opening of the mask, the through via 143 of nickel (Ni) is formed. Conformal plating, for instance, may be used to form the through via 143.

Next, after the mask is removed, the exposed portion of the seed metal layer and barrier metal layer are removed. As a result, patterning of the seed metal layer 142 and the barrier metal layer 141 remaining under the through via 143 is performed. For patterning of the seed metal layer 142 and the barrier metal layer 141, wet etching may be used.

Then, on the upper surface of the through via 143 thus formed, the material film 144 of gold (Au) is formed. A formation method such as lift-off may be used to form the material film 144. As a result, as depicted in FIG. 2, on the element formation surface of the semiconductor substrate 10, the first through via 14 that connects the wiring structure 35 to an area on the insulating layer 13 is formed.

Figure 3:
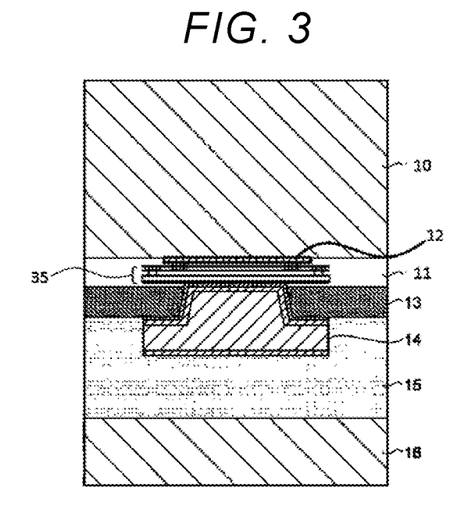
FIG. 3 is a sectional view of a partially completed semiconductor device depicting the result of a step in the method for producing the semiconductor device according to the embodiment.

Next, as depicted in FIG. 3, by applying an adhesive 15 to the insulating layer 13 in which the first through via 14 is formed and bonding a supporting substrate 16 to this adhesive, the supporting substrate 16 is bonded to the side of the semiconductor device 1 where the element formation surface is located. Then, by grinding away a portion of the semiconductor substrate 10 from the second surface opposite to the element formation surface in a state in which the supporting substrate 16 is fixed to a stage, the semiconductor substrate 10 is thinned to a thickness of the order of 30±5 μm, for example.

Figure 4:
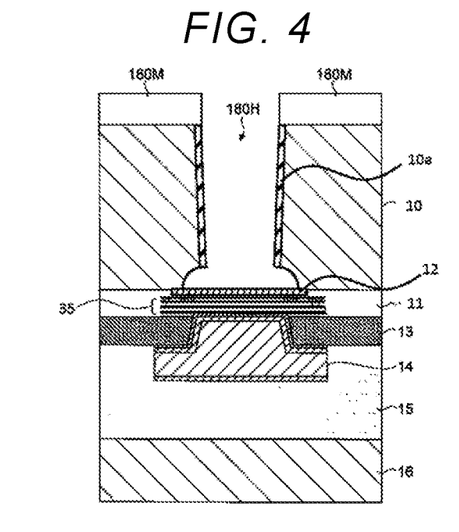
FIG. 4 is a sectional view of a partially completed semiconductor device depicting the result of a step in the method for producing the semiconductor device according to the embodiment.

Then, as depicted in FIG. 4, a photosensitive photoresist 180M is applied to the semiconductor substrate 10, and an opening pattern for forming the second through via 18 is transferred to the photoresist 180M. The opening width or diameter of the opening pattern may be about 10 μm, for example. Then, by etching a hole in the semiconductor substrate 10 from the second surface side using, as a mask, the photoresist 180M to which the opening pattern was transferred, a through via hole 180H reaching the wiring structure 35 is formed. For etching of the via hole 180H, anisotropic plasma etching that can etch a high aspect ratio feature is used to form the via hole 180 in the semiconductor substrate 10. Plasma etching is anisotropic etching using reactive ion etching (RIE). When anisotropic plasma etching of the silicon substrate is performed, a mixed gas that contains $SF_6$, $O_2$ and $SiF_4$, and at least one of, $CF_4$, $Cl_2$, $BCl_3$, $CF_3I$, and HBr and does not contain CHx, for example, is used, and the substrate is electrically negatively biased with respect to the plasma. In the mixed gas, $O_2$, $SiF_4$, $CF_4$, $Cl_2$, $BCl_3$, $CF_3I$, and HBr have the function of forming a protective film 10a, whereas F ions in the $SF_6$ gas and the $SiF_4$ gas have the function of etching the silicon. When etching is performed, the mixed gas is ionized to form radicals and ions by using plasma. Furthermore, the ions of the mixed gas formed by the plasma are drawn toward the substrate in the depth direction of the substrate, and into the through via hole 180H to enhance the anisotropy of etching, by the effect of bias applied to the substrate or an underlying substrate support on the electrically charged ions. This mixed gas contains $SF_6$, $O_2$ and $SiF_4$, and at least one of $CF_4$, $Cl_2$, $BCl_3$, $CF_3I$, and HBr.¥ As a result, on the side wall of the through via hole 180H, a protective film 10a containing Si, O, (e.g., silicon oxide) and at least one or more elements of F, Cl, I, and Br is formed on the sidewall simultaneously with the etching on the via hole in the depth direction. By forming the protective film 10a, etching is prevented from being performed in the horizontal direction, i.e., on the sidewall, in the through via hole as the through via hole is etched into the silicon. By preventing etching from being performed in the horizontal direction, i.e., by preventing substantial etching of the sidewall, the effect of anisotropic etching in the depth direction of the semiconductor substrate 10 can be enhanced because the fluorine containing gas is not wasted on etching of the sidewall surface. However, as the through silicon via depth increases toward its total depth, the surface reaction forming the coating on the sidewall becomes less efficient, and an undercut region can be formed where the sidewall does become etched.

Figure 5:
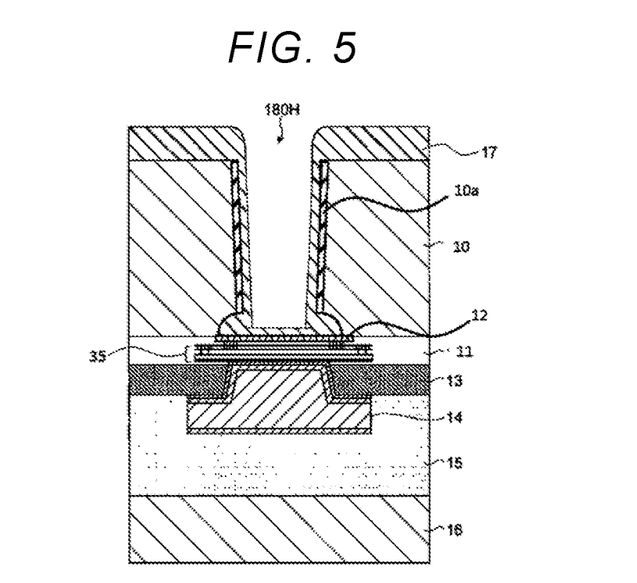
FIG. 5 is a sectional view of a partially completed semiconductor device depicting the result of a step in the method for producing the semiconductor device according to the embodiment.

Next, as depicted in FIG. 5, on the entire portion of the second surface of the semiconductor substrate 10 including the inside surfaces of the through via hole 180H, the insulating layer 17 is formed. For the film formation of the insulating layer 17, CVD, for example, is used.

Figure 6:
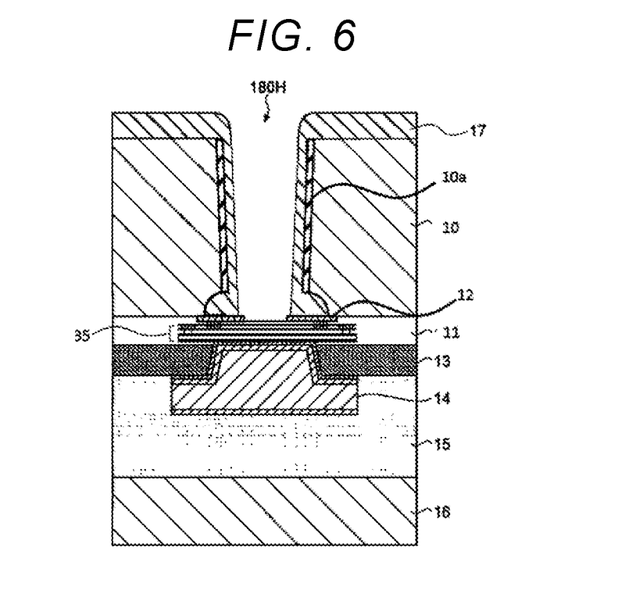
FIG. 6 is a sectional view of a partially completed semiconductor device depicting the result of a step in the method for producing the semiconductor device according to the embodiment.

Then, insulating layer overlying the STI 12 material and the underlying STI 12 material at the base of the hole 180H are removed by etching. This etching is performed until the exposed portion of the STI 12 is removed and the wiring structure 35 is exposed. As a result, as depicted in FIG. 6, the insulating layer 17 remains on the second surface of the semiconductor substrate 10 and the inner side face of the through via hole 180H, and the wiring structure 35 is exposed at the bottom of the through via hole 180H.

Figure 7:
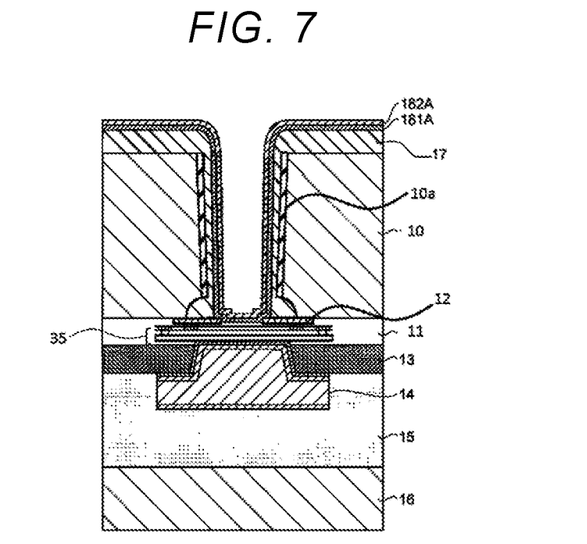
FIG. 7 is a sectional view of a partially completed semiconductor device depicting the result of a step in the method for producing the semiconductor device according to the embodiment.

Next, as depicted in FIG. 7, on the entire portion of the insulating layer 17 including the inside of the through via hole 180H, and the exposed portion of the wiring structure 35 therein, a continuous barrier metal layer 181A using titanium (Ti) and a continuous seed metal layer 182A using copper (Cu) are formed in that order. The barrier metal layer 181A and the seed metal layer 182A are sometimes referred to simply as metal layers. The film thickness of the seed metal layer 182A may be greater than the film thickness of the seed metal layer 142A.

Figure 8:
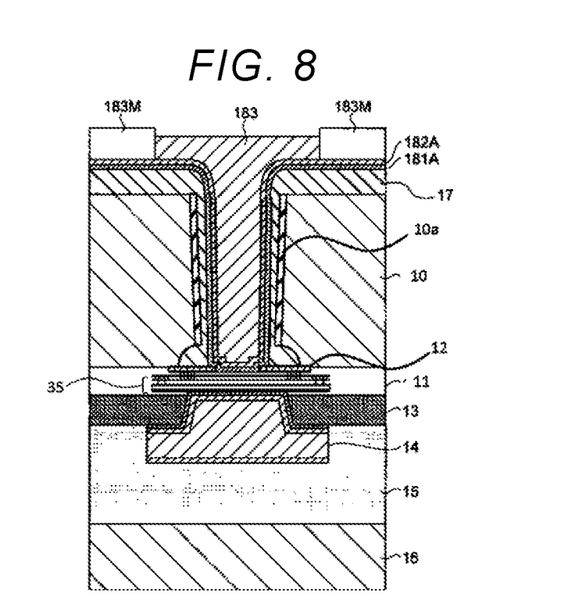
FIG. 8 is a sectional view of a partially completed semiconductor device depicting the result of a step in the method for producing the semiconductor device according to the embodiment.

Then, a mask 183M for forming the through via 183 is formed on the seed metal layer 182A by using PEP, for example. In the mask 183M, an opening is formed in a position corresponding to the position of the through via hole 180H formed in the semiconductor substrate 10. Next, as depicted in FIG. 8, on the seed metal layer 182A exposed through the opening of the mask 183M, the through via 183 of nickel (Ni) is formed. Conformal plating, for example, may be used to form the through via 183.

Next, after the mask 183M is removed, the exposed portions of the seed metal layer 182A and barrier metal layer 181A are removed. Wet etching may be used to remove the seed metal layer 182A and the barrier metal layer 181A.

Then, the bonding material 19 is bonded to the upper surface of the through via 183 projecting from the insulating layer 17. Electrolytic plating or electroless plating, for example, may be used to form the bonding material 19. By the processes described above, the second through via 18 that electrically connects the wiring structure 35 to an area on the insulating layer 17 is formed on the side of the semiconductor substrate 10 where the second surface is located, whereby the semiconductor device 1 with the cross-section structure depicted in the FIG. 1 is produced.

Here, a method for producing a semiconductor device in a comparative example will be described.

Figure 9A:
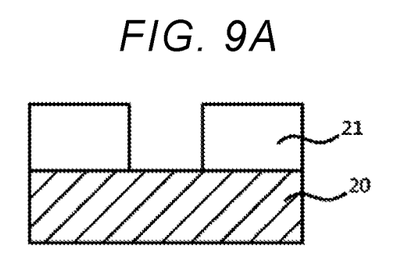
FIGS. 9A to 9D are sectional views depicting a partially completed semiconductor device after steps in a method for producing a semiconductor device according to a comparative example.
Figure 9B:
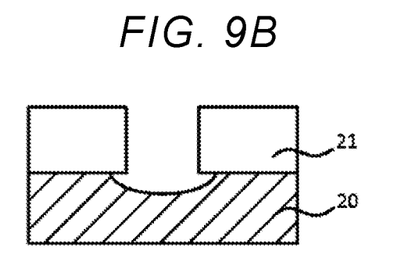
Figure 9C:
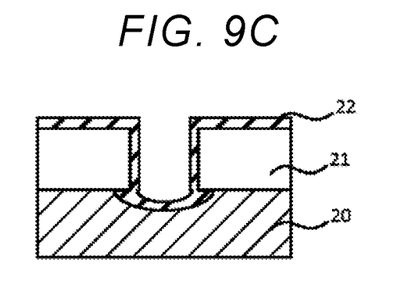
Figure 9D:
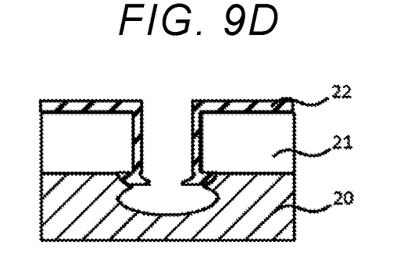

In the method for producing the semiconductor device in the comparative example, etching by the Bosch process is performed. FIGS. 9A to 9D are diagrams depicting the method for producing the semiconductor device in the comparative example. In FIG. 9A, a patterned insulating film 21 is provided on the substrate 20. As depicted in FIG. 9B, by performing isotropic etching using gas whose principal ingredient is $CF_6$, a hole is etched into a semiconductor substrate 20 through the opening in the patterned insulating film 21. Next, as depicted in FIG. 9C, a protective film 22 is formed on the substrate 20 and the insulating film 21 using $C_4F_8$ gas. Then, as depicted in FIG. 9D, by performing isotropic etching using gas whose principal ingredient is $SF_6$ in a manner similar to FIG. 9B, a hole is bored in the semiconductor substrate 20. Subsequently, boring a hole in the semiconductor substrate and forming a protective film are repeated by the same methods as those described in FIGS. 9B and 9C.

Figure 10A:
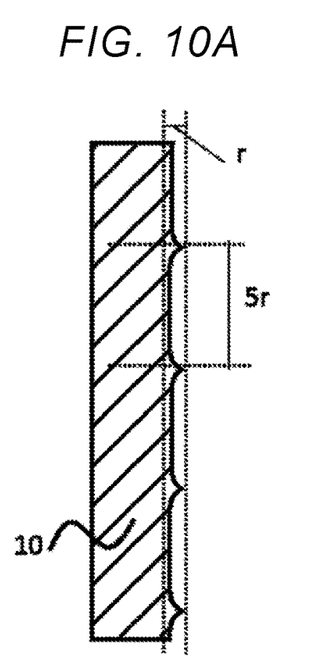
FIGS. 10A and 10B are each a sectional enlarged view of the side wall of a through via hole.
Figure 10B:
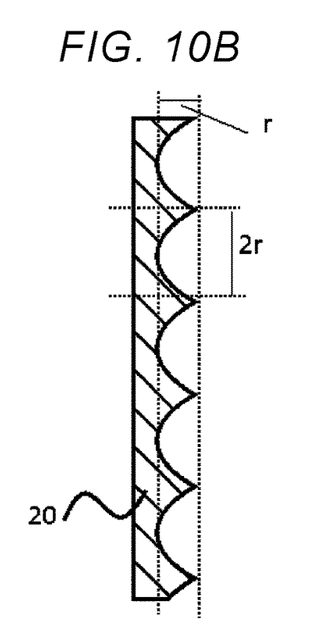

FIGS. 10A and 10B are enlarged views of the side walls of the semiconductor substrates 10 and 20, respectively, after the through via holes nave been bored in the semiconductor substrates 10 and 20. FIG. 10A is a diagram depicting the side wall of the semiconductor substrate 10 of the present embodiment, and FIG. 10B is a diagram depicting the side wall of the semiconductor substrate 20 in the comparative example. As depicted in FIGS. 10A and 10B, when holes are formed in the semiconductor substrates 10 and 20 by etching using a dipole ring electromagnet, an uneven sidewall surface (referred to as scallops) is formed because etching is also performed in the horizontal direction of the semiconductor substrate at different rates along the depth direction of the via. Each scallop includes a valley (or base portion) and opposed peaks (or projections) on either side of the valley in the depth direction of the via hole. However, as depicted in FIG. 10A, by performing etching with high anisotropy, the depth (r) of the valleys with respect to the adjacent peaks in the scalloped portion (hereinafter referred to as depressions) formed in the horizontal direction can be made to be $\frac{1}{5}$ or less of the distance (5r) between adjacent projections in the uneven portion (hereinafter referred to as projections) on the side face of the through via hole. Here, the distance between the adjacent projections is, for example, the distance between the highest parts of the adjacent projections. Moreover, the depth of the depressions is assumed to correspond to the height of the projections. On the other hand, as depicted in FIG. 10B, since in the Bosch process a hole is formed in the semiconductor substrate 20 by isotropic etching in the method for producing the semiconductor device of the comparative example, the semiconductor substrate 20 is also etched in the horizontal direction by virtually the same amount as the depth of the etched opening in the depth direction in each etch cycle. As a result, the ratio of the depth (r) of the depressions formed in the horizontal direction to the distance (2r) between the adjacent projections is $\frac{1}{2}$. The flatness of the side wall of the through via hole of the semiconductor substrate 20 in the comparative example is less than the flatness of the side wall of the through via hole of the semiconductor substrate 10 of the embodiment hereof. In this case, when a metal via structure is formed in the through via hole formed using the Bosch process, a region in which no metal is formed may occur. The region in which no metal is formed becomes the cause of a defective device.

In the method for producing a semiconductor device of the present embodiment, a hole is formed in the semiconductor substrate 10 by etching using mixed gas containing $SF_6$, $O_2$, $SiF_4$, and at least one of $CF_4$, $Cl_2$, $BCl_3$, $CF_3I$, and HBr. As a result, the anisotropy of etching can be enhanced. The reduction of the anisotropy of etching reduces the depth of the scallops along their depth direction into the through silicon via. In addition, unlike the comparative example, in the semiconductor production method of the present embodiment, one does not need to repeatedly perform the steps of etch a portion of the hole into a semiconductor substrate, and thereafter form a protective film on the sidewall of the opening, to reach the required opening depth.

Moreover, the semiconductor production method of the present embodiment can prevent a decrease in the flatness of the side wall of a through via hole, which is observed in the semiconductor production method of the comparative example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a device layer on a first surface of the semiconductor substrate, the device layer including wiring;
a through via within a through via hole passing through the semiconductor substrate from the first surface to a second surface on an opposite side thereof from the first surface, the through via hole comprising a side wall including a plurality of scallops extending inwardly thereof and disposed sequentially in the depth direction of the through via hole, each scallop having a base region and opposed projections extending inwardly of the through via hole and spaced from each other in the depth direction of the through via hole across the base region, wherein the height of the projections extending inwardly of the through silicon via from the base region is $\frac{1}{5}$ or less the spacing between the adjacent projections in the depth direction of the through via hole; and
a protective film containing Si, O, and at least one or more of F, Cl, I, and Br located on the side wall of the through via hole.

2. The semiconductor device according to claim 1, wherein the protective film includes the scallops along the surface thereof facing inwardly of the through via hole.

3. The semiconductor device according to claim 1, further comprising a continuous barrier layer on the protective film.

4. The semiconductor device according to claim 3, further comprising a continuous seed layer on the barrier layer.

5. The semiconductor device according to claim 4, wherein a conductor is located on the seed layer in the conductive via hole.

6. The semiconductor device according to claim 5, wherein a portion of the conductor at the second surface of the semiconductor substrate includes a conductive bump thereon.

* * * * *